United States Patent [19]

Fukuda

[11] Patent Number: 5,311,118
[45] Date of Patent: May 10, 1994

[54] RIPPLE ELIMINATION IN A FREQUENCY-TO-VOLTAGE CONVERTER FOR A CROSS-COIL METER

[75] Inventor: Kazuyuki Fukuda, Kyoto, Japan

[73] Assignee: Rohm Co., Ltd., Kyoto, Japan

[21] Appl. No.: 760,064

[22] Filed: Sep. 13, 1991

[30] Foreign Application Priority Data

Sep. 14, 1990 [JP] Japan .................. 2-245000

[51] Int. Cl.$^5$ .............. G01R 5/14; G01R 3/481; G01R 23/06; H03K 5/19
[52] U.S. Cl. ................. 324/144; 307/261; 307/519; 307/520; 324/76.39; 324/146; 324/166; 328/165
[58] Field of Search ........... 324/78 E, 78 F, 119, 324/120, 144, 146, 158 MG, 160, 163, 166; 307/519, 520, 261; 323/140, 165, 167; 363/45, 46; 328/165

[56] References Cited

U.S. PATENT DOCUMENTS

| | | | |
|---|---|---|---|
| 3,875,539 | 4/1975 | Fendrich, Jr. | 328/165 X |
| 3,893,014 | 7/1975 | Vacek | 324/161 X |
| 4,594,648 | 6/1986 | Gallios | 328/167 X |
| 4,682,369 | 7/1987 | Schrader | 363/46 X |
| 4,890,057 | 12/1989 | Kobayashi et al. | 324/166 X |

*Primary Examiner*—Gerard R. Strecker
*Attorney, Agent, or Firm*—Fish & Richardson

[57] ABSTRACT

A frequency-to-voltage converter comprises a pulse generator, an integrator, an inverting amplifier, and a superimposing circuit. The pulse generator generates a pulse signal having a predetermined width. The integrator integrates and outputs the pulse signal. The inverting amplifier reverses the ripple component of the output of the integrator, outputting the reversed ripple component. The superimposing circuit superimposes the reversed ripple component on the output of the integrator. An automobile meter according to this invention comprises a frequency-to-voltage converter, a plurality of driving signal generators, and a plurality of pointer driving coils. The drive signal generators generate driving signals having values according to the output value of the integrator, applying the drive signals to pointer driving coils.

13 Claims, 10 Drawing Sheets

RIPPLE ELIMINATION IN A FREQUENCY-TO-VOLTAGE CONVERTER FOR A CROSS-COIL METER

BACKGROUND OF THE INVENTION

1. Field of the Invention

This invention relates to a frequency-to-voltage converter for converting the frequency (F) of the input signal from a rotational system to a voltage (V), which converter is applicable to automobile meters such as a speedometer and a tachometer.

2. Description of the Related Art

Figure 10:
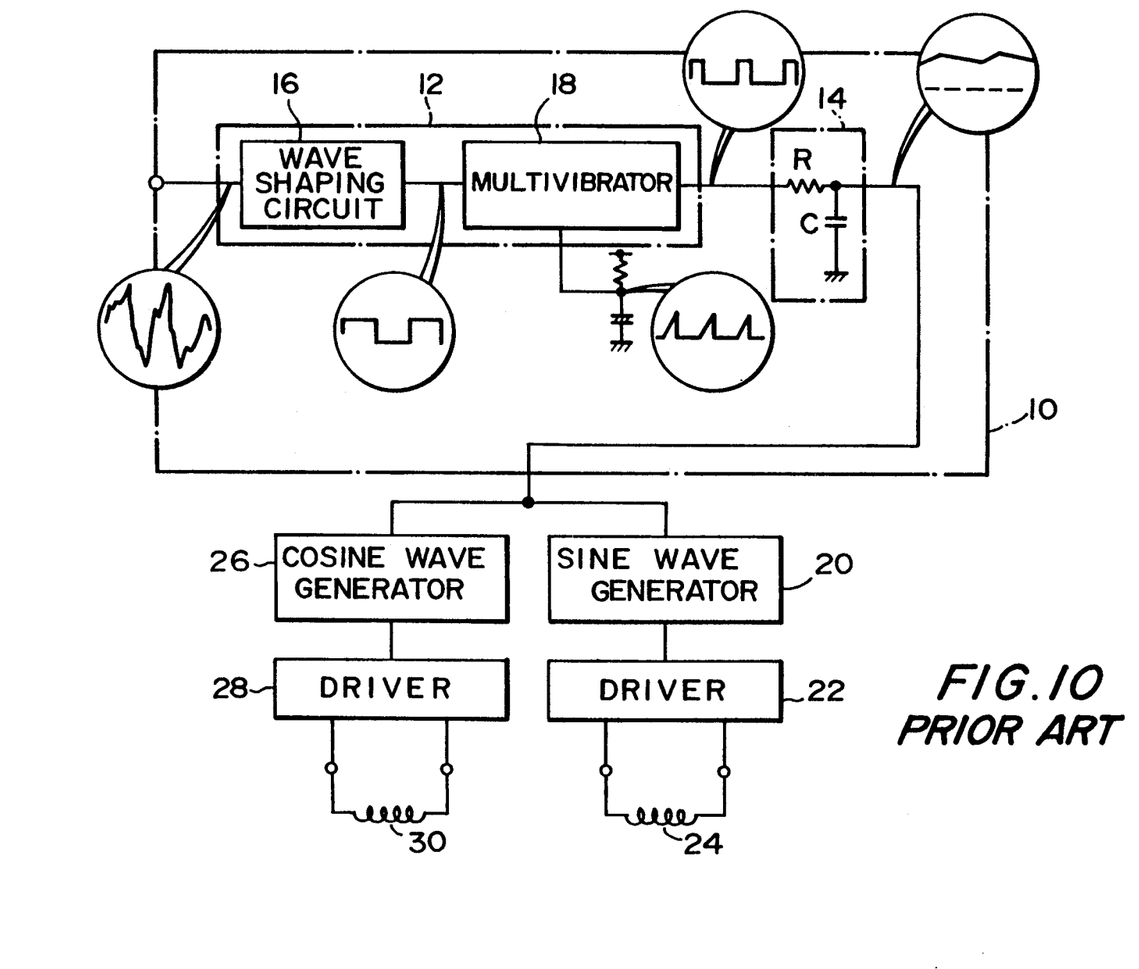
FIG. 10 is a circuit diagram of a meter driving circuit of a conventional frequency-to-voltage converter.

FIG. 10 of the accompanying drawings shows a meter driving circuit employing a conventional frequency-to-voltage converter.

As shown in FIG. 10, a frequency-to-voltage converter 10 comprises a pulse generator 12 and an integrator 14. The pulse generator 12 includes a wave shaping circuit 16 and a monostable multivibrator 18, generating a pulse signal for each input signal. This pulse signal has a constant width regardless of the frequency of the input signal. The integrator 14 includes a capacitor C and a resistor R, integrating the pulse signal to generate a signal voltage. Thus the frequency (F) is converted into the voltage (V).

In FIG. 10, reference numeral 20 stands for a sine wave generator to generate a sine variable having the value according to the voltage of the signal generated by the integrator 14. A driver 22 outputs the modulated SIN output defined by sin θ to a pointer driving coil 24.

A cosine wave generator 26 generates a cosine variable having the value according to the signal voltage of the integrator 14. A driver 28 outputs the modulated COS output defined by cos θ to a pointer driving coil 30.

The pointer driving coils 24, 30 are arranged to cross each other, moving the pointer according to the angle θ of the sine wave and cosine wave outputs, respectively.

However, such frequency-to-voltage converter suffers from a problem that the output voltage of the integrator 14 has a ripple component. When an input signal to the frequency-to-voltage converter has a low frequency, the ripple component in the output becomes large, moving the meter pointer by the low frequency of the ripple component. To diminish the ripple component, it is enough to enlarge a time constant which is a product of the capacitor C and the resistor R of the integrator 14. However, such measure will reduce a response speed of the meter. Otherwise, the ripple component would become large, moving the meter pointer excessively.

SUMMARY OF THE INVENTION

It is therefore an object of this invention to provide a frequency-to-voltage converter which can eliminate the ripple component from the output signal voltage.

According to a first aspect of this invention, there is provided a frequency-to-voltage converter comprising: a pulse generator for generating a periodic pulse signal which has a predetermined width at a predetermined period for each input signal; an integrator for integrating the pulse signal and outputting the integrated signal; means for detecting and inverting a ripple component in the output of the integrator and transmitting an inverted output; and a superimposing circuit for superimposing the output from the inverting means on the output of the integrator.

With this arrangement, the ripple component in the output of the integrator is eliminated by the output of the inverting means having the phase opposite to the phase of the ripple component.

The inverting means preferably includes a detecting unit and an inverting amplifier. The detecting unit eliminates the direct current component from the output of the integrator, detecting the remaining components of the output as the ripple component. The inverting amplifier inverts and amplifies the ripple component. These means are easy to constitute.

The detecting unit may have a capacitor. The inverting amplifier includes means for converting to current the ripple component, means for inverting and amplifying the current-converted ripple component, and a voltage converter for converting the voltage of the current-inverted-and-amplified ripple component and outputting the voltage-converted ripple component to the superimposing circuit.

The current-inverting-and-amplifying means includes first and second differentially connected transistors, a constant current source, and a current mirror circuit. The first transistor receives the current-converted ripple component. The constant current source supplies a constant current to the first and second transistors. The current mirror circuit varies the current flowing to the second transistor as to have common phase with the current flowing to the first transistor.

When the foregoing current-inverting-and amplifying means is used, the voltage converter includes at least three transistors. One of the transistors is used for generating a voltage whose phase is reversed when a current flowing through the second transistor is varied. The other two transistors are for outputting a voltage which varies in the phase opposite to the phase of the ripple component.

A feedback resistor is used to determine an amplification factor of the inverting amplifier.

The inverting amplifier also includes at least three transistors, first to third transistors. The first transistor receives the ripple component and the resistance between an emitter and collector changes with the variation of the ripple component in phase. The second transistor is used so that its output voltage is varied in the phase opposite to the phase of the change of resistance between the emitter and collector of the first transistor. The third transistor is for supplying to the superimposing circuit a voltage which is varied to a phase in common with the phase of the output voltage of the second transistor according to the variation of the change of resistance between the emitter and collector of the second transistor.

The superimposing circuit includes a coupling capacitor. The integrator includes a resistor and a capacitor. The pulse generator includes a wave shaping circuit for shaping the waveform of the input signal, and a multivibrator for generating a periodic pulse signal at predetermined periods of the wave-shaped input signal.

The frequency-to-voltage converter is applicable to an automobile meter. Such meter comprises: a frequency-to-voltage converter described above; a driving signal generator adapted to generate a plurality of driving signals having different values according to output values of the integrator respectively; and a plurality of pointer driving coils which are arranged so as to cross each other and to which driving signals are applied from the respective associated drive signal generators.

With this arrangement, a plurality of driving signals can be generated from the ripple-free output of the frequency-to-voltage converter. The driving signals are applied to the pointer driving coil, so that the meter pointer is free from interference of the ripple component.

Specifically, with such automobile meter, the driving signal generator includes a sine wave generator and a cosine wave generator. The sine wave generator generates a signal having sine value according to the output value $\theta$ of the integrator as the driving signal. The cosine wave generator generates a signal having cosine value according to the output value $\theta$ of the integrator as the drive signal. The automobile meter further includes two meter driving coils which are arranged to cross each other.

DETAILED DESCRIPTION

Figure 1A:
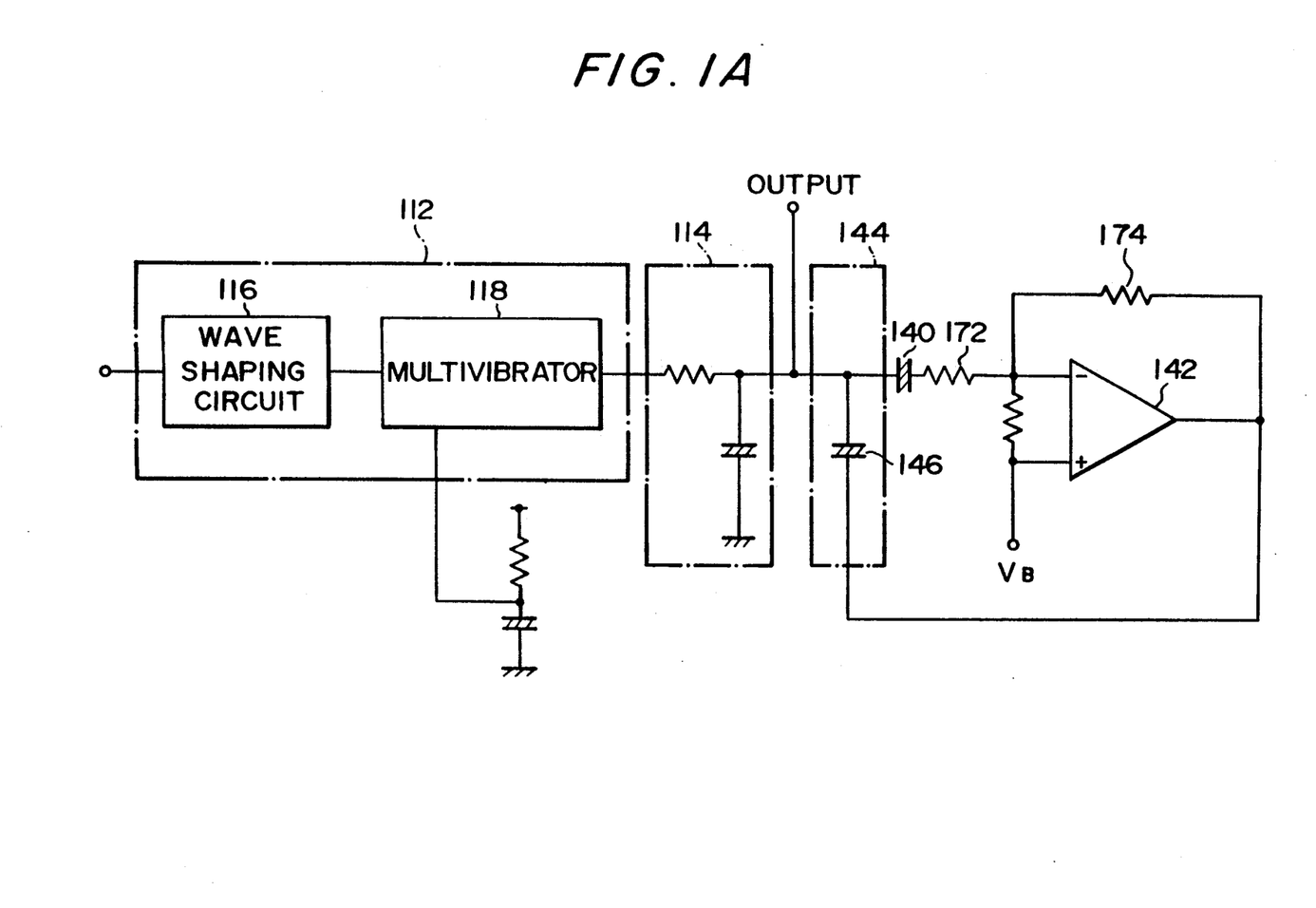
FIGS. 1A and 1B are circuit diagrams showing a frequency-to-voltage converter according to a first embodiment of this invention.

A frequency-to-voltage converter according to the first embodiment will be described with reference to FIG. 1 to FIG. 8. FIG. 1A shows an inverting amplifier in block form, and FIG. 1B shows the inverting amplifier in detail.

In this embodiment, a pulse generator 112 includes a wave shaping circuit 116 and a multivibrator 118, operating similarly to a pulse generator of a conventional frequency-to-voltage converter. An integrator 114 functions similarly to an integrator of the conventional frequency-to-voltage converter.

Figure 2:
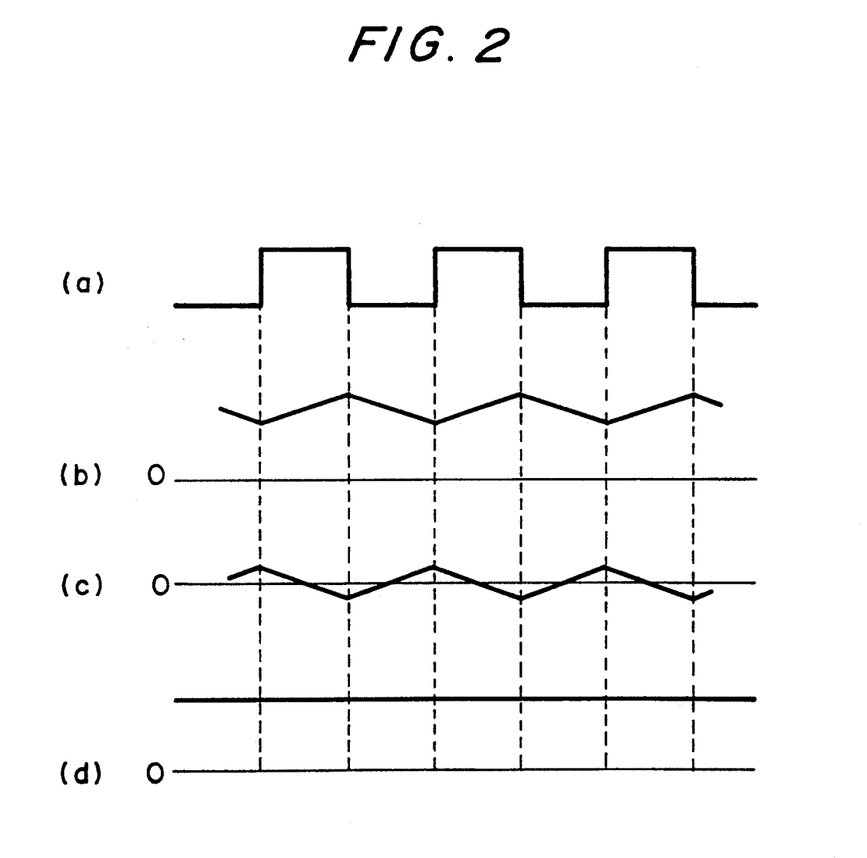
FIG. 2 is a timing charts showing the operation of the frequency-to-voltage converter of FIGS. 1A and 1B.

The integrator 114 of FIG. 1A receives a pulse signal as shown in (a) of FIG. 2, outputting a signal voltage (including a ripple component) as shown in (b) of FIG. 2. In FIG. 1A, reference numeral 140 represents a capacitor to extract the ripple component and to eliminate the direct-current component from the signal voltage outputted by the integrator 114. An inverting amplifier 142 reverses the output of the capacitor 140 as shown in (c) of FIG. 2, amplifying the output to be larger than the amplitude of the ripple component, as shown in (b) of FIG. 2. A superimposing circuit 144 superimposes, via a coupling capacitor 146, the inversely-amplified output on the signal voltage outputted from the integrator 114, eliminating the ripple component from the signal voltage as shown in (d) of FIG. 2.

Figure 1B:
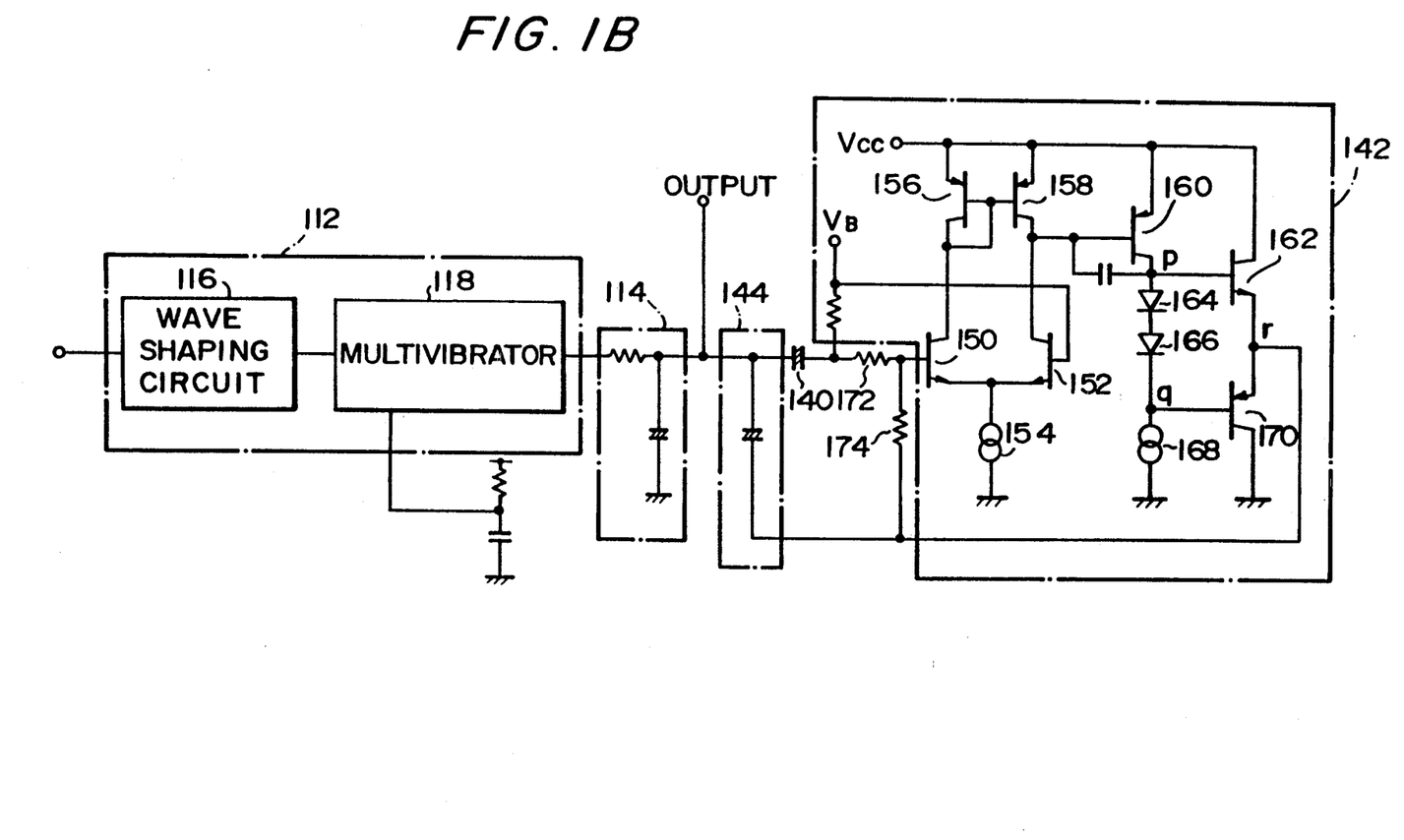

Operation of the frequency-to-voltage converter will be now described referring to FIG. 1B.

The ripple component in the signal voltage of the integrator 114 is extracted by the capacitor 140, being applied to a base of a transistor Tr150. The bases of the transistors Tr150, Tr152 are clamped by a bias voltage $V_B$. When a ripple component is applied to make a base potential of the transistor Tr150 higher than a base potential of the transistor Tr152, a current increases in an emitter of the transistor Tr150, but a current decreases in an emitter of the transistor Tr152 connected to a constant power supply 154. Then, to cope with the increase of the current in the transistor Tr150, the circuit functions as follows. Specifically, excitation of a transistor Tr156 connected to the bias voltage Vcc is enhanced. Since transistors Tr156, Tr158 are forming a current-mirror circuit, the transistor Tr158 is also excited. Therefore, the current to a transistor Tr160 is decreased, lowering a base potential of the transistor Tr162 connected to a collector of the transistor Tr160, i.e., the potential at the point p. The potential at the point q, where diodes 164, 166 are connected to a constant current source 168, i.e. the base potential of a transistor Tr170, is lowered. Thereafter, excitation of the transistor Tr170 is enhanced, lowering the potential at the point r where the transistors Tr162, Tr170 are connected.

Specifically, when the voltage of the ripple component at the base of the transistor Tr150 is raised, the potential at the point r (i.e. inversely-amplified signal voltage) is lowered. On the contrary, when the voltage of the ripple component at the base of the transistor Tr150 is lowered, the inversely-amplified signal voltage is raised. The amplification factor of the inverting amplifier 142 depends upon the ratio between the resistors R172, R174. In this embodiment, the amplification factor is determined to be larger than the amplitude of the ripple component.

The inversely-amplified signal is returned to an output line of the integrator 114 by the superimposing circuit 144. Therefore, the signal voltage to be outputted by the circuit is a signal voltage without the ripple component.

The integrated signal voltage without the ripple component is supplied from the integrator 114 to a sine wave generator and a cosine wave generator as shown in FIG. 10, for example. Since the signal voltage of the integrator 114 has the DC voltage according to the input signal frequency, the sine and cosine wave generators can generate sine and cosine values without any ripple variation. Therefore, it is possible to prevent undesirable movement of the pointer without sacrificing response speed of the meter.

Figure 3:
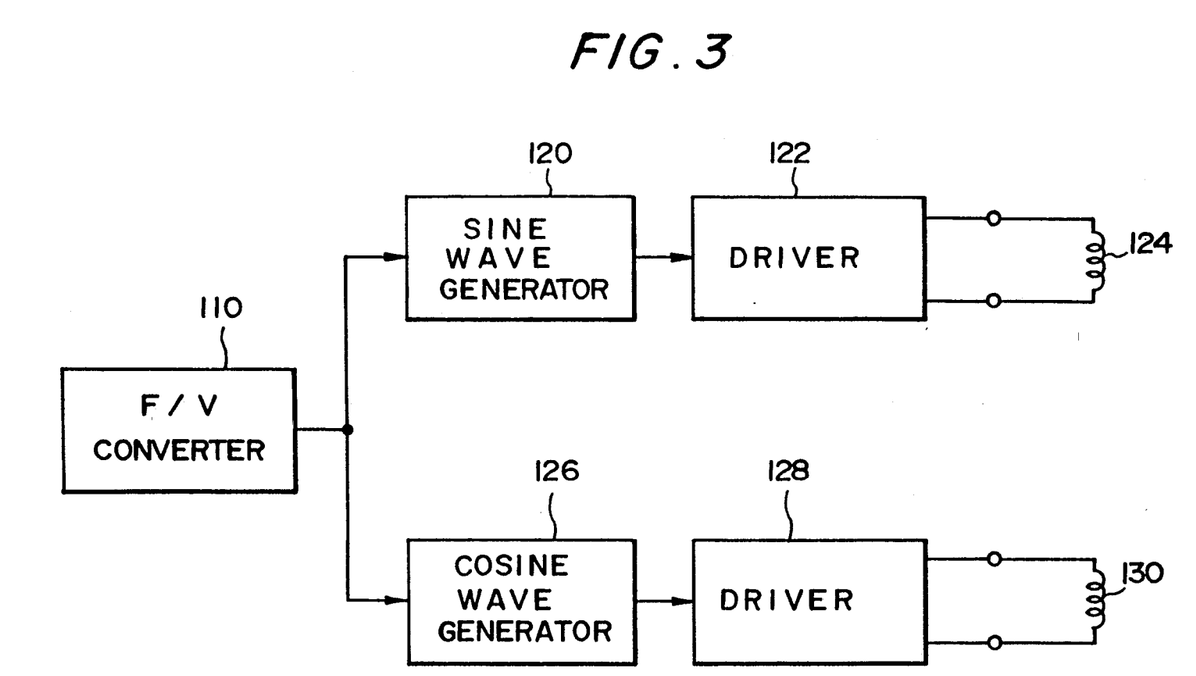
FIG. 3 is a block diagram of an automobile meter using the frequency-to-voltage converter of FIGS. 1A and 1B.

FIG. 3 is a block diagram of an automobile meter using the frequency-to-voltage converter 110 of FIGS. 1A to 2.

As shown in FIG. 3, the automobile meter includes not only the frequency-to-voltage converter 110 but also a sine wave generator 120, a cosine wave generator 126, drivers 122, 128, and pointer driving coils 124, 130.

The sine and cosine wave generators 120, 126 generate respectively sine and cosine values according to an output voltage of the frequency-to-voltage converter 100 (i.e. output voltage of the integrator 114 which is corresponding to the desired pointer angle $\theta$). The sine and cosine values are respectively applied to the drivers 122, 130 to generate the drive signals which varies by $\theta$ and drive the pointer driving coils 124, 130.

The drivers 122, 128 output the driving voltage to the pointer driving coils 124, 130, respectively. The pointer driving coils 124, 130 respectively set the meter pointers in motion.

Figure 4:
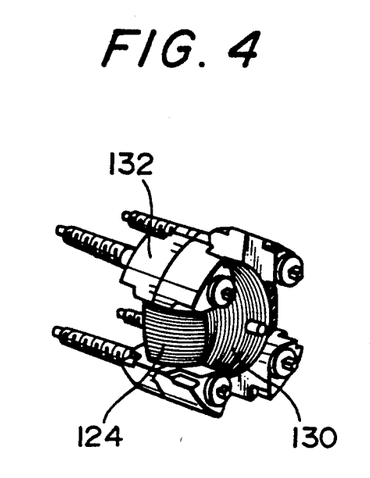
FIG. 4 is a perspective view of a pointer driving coil of the first embodiment of this invention.
Figure 5:
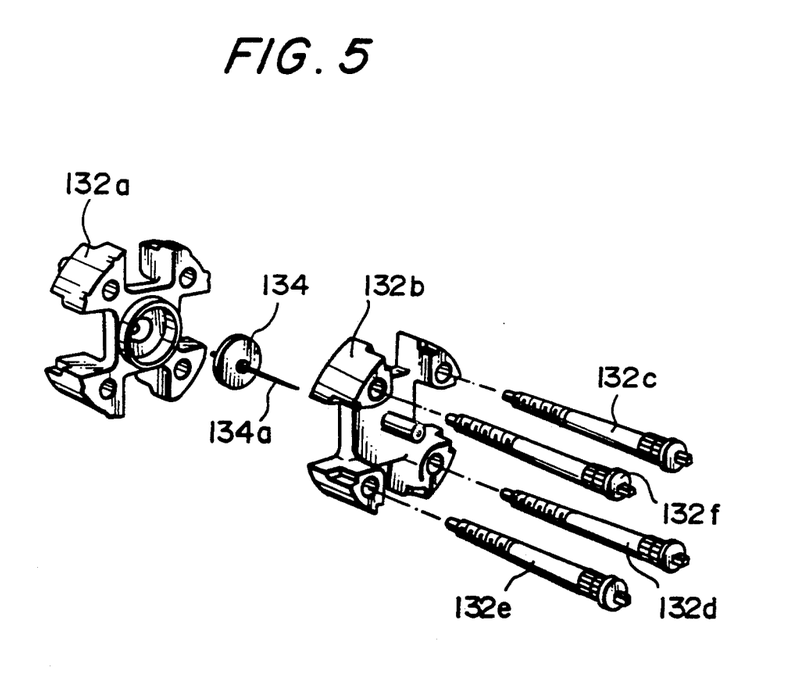
FIG. 5 is an exploded view of a bobbin having the pointer driving coil of FIG. 4 wound thereon.

The structure and arrangement of the coils 124, 130 are respectively shown in FIGS. 4 and 5.

As shown in FIGS. 4 and 5, the coil 130 is wound around a bobbin 132 to cross the coil 124. The bobbin 132 has two pieces 132a, 132b, which are coupled and fastened each other by four screws 132c to 132f. A disc magnet 134 is sandwiched between the pieces 132a, 132b to be movable about a shaft 134a. A non-illustrated pointer is positioned at one end of the shaft 134a of the disc magnet 134.

When the current flows through the coils 124, 130, a magnetic field is formed around the coils 124, 130. This magnetic field attracts or repulses the magnetic field formed by the magnet 134. Therefore, the magnet 134 turns around the shaft 134a, moving the pointer.

Figure 6:
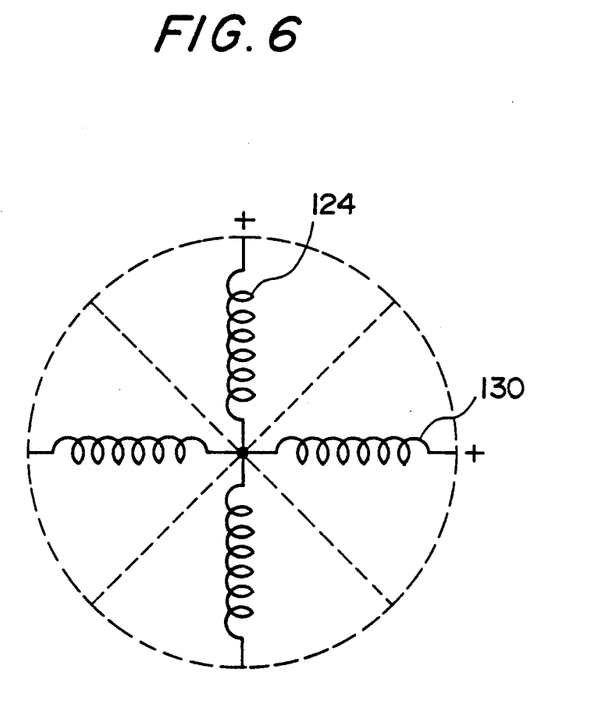
FIG. 6 is a circuit diagram showing the arrangement of the pointer driving coils.
Figure 7:
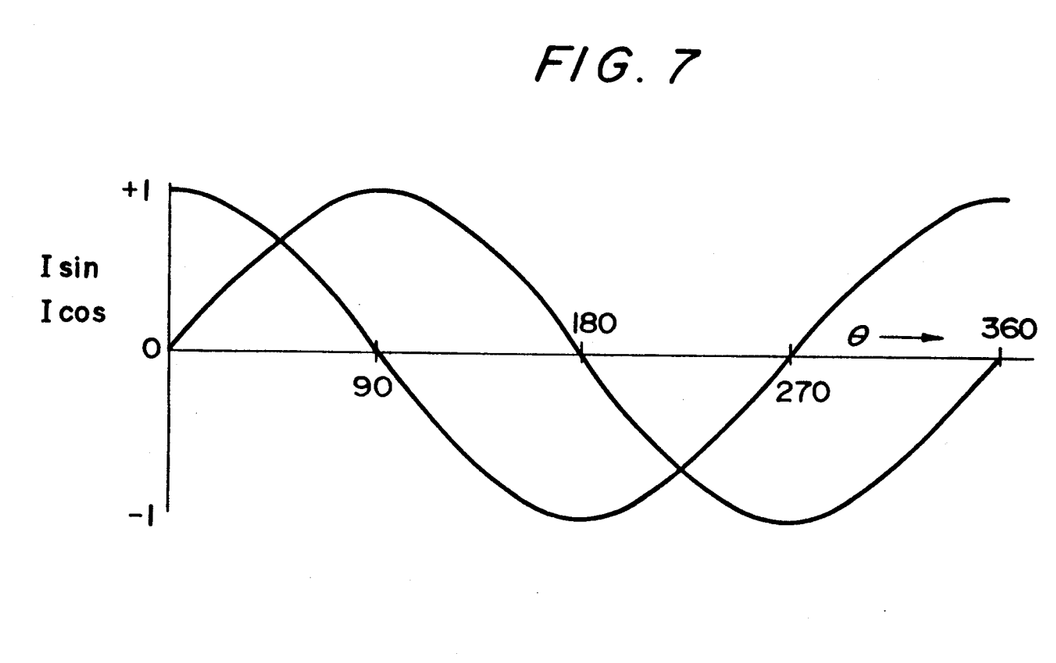
FIG. 7 shows value-variation of a driving signal according to the integrator output.
Figure 8:
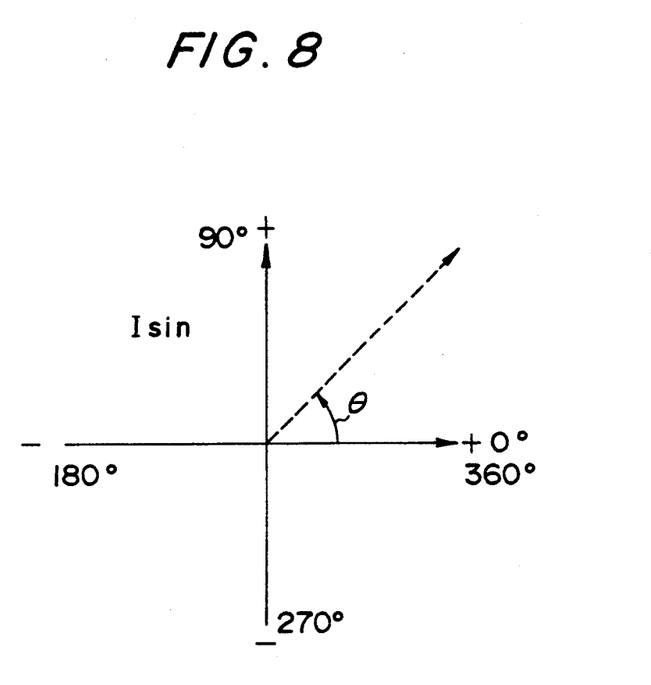
FIG. 8 shows the principle for driving the pointer.

Both the coils 124, 130 are arranged to cross to each other as shown in FIG. 6. The coils 124, 130 respectively receive the voltage from the driver 122, and the voltage from the driver 128, as shown in FIG. 7. When vectors of the currents flowing through the coils 124, 130 are synthesized as shown in FIG. 8, it is conceivable that a magnetic field is formed by these currents.

It is assumed that the current value Isin is made to generate the drive signal for the coil 124 and that the current value Icos is made to generate the drive signal for the coil 130. The meter pointer will be moved by an angle $\theta$ which is determined by:

$$\theta = \tan^{-1}(Isin/Icos).$$

With this automobile meter, the pointer is moved by the ripple-free output of the frequency-to-voltage converter 110, giving indication without unnecessary movement.

Figure 9:
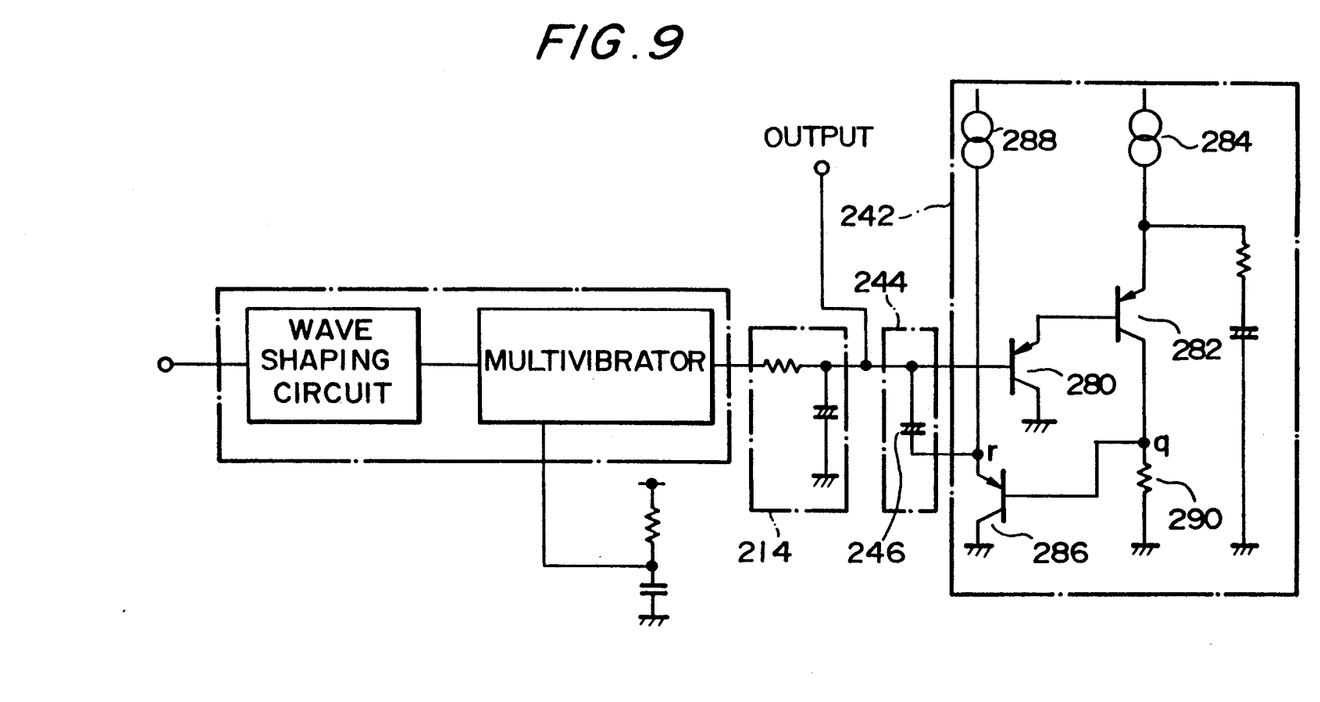
FIG. 9 is a circuit diagram of a frequency-to-voltage converter according to a second embodiment of this invention.

A frequency-to-voltage converter according to a second embodiment of this invention includes a circuit shown in FIG. 9. This circuit is simplified compared with the circuit of FIG. 1 with respect to an inverting amplifier 242 and its peripheral configuration.

In this embodiment, when the voltage of the ripple component in the signal voltage, applied to the base of the transistor Tr280 from the integrator 214, is raised, excitation of the transistor Tr280 is canceled, increasing the resistance between the emitter and collector of the transistor Tr280. The voltage on the emitter of the transistor Tr280 is raised, causing the potential on the base of the transistor Tr282 to be raised too. Excitation of the transistor Tr282 is canceled, decreasing the current flowing to the transistor Tr282 from the constant current source 284. The current is decreased in the collector of the transistor Tr282, lowering the potential at the point q. Since the potential at the point q is supplied to the base of the transistor Tr286, excitation of the transistor Tr286 is enhanced. The resistance between the emitter and collector of the transistor Tr286 connected to the constant current source 288 is decreased, lowering the potential at the point r.

When the potential of the ripple component applied to the base of the transistor Tr280 rises, the potential at the point r (inversely amplified signal voltage) is lowered. Otherwise, the output of the inversely-amplified signal rises. The amplification factor of the inverting amplifier 242 is determined based on the resistance of the resistor 290 and the current value of the constant power supply 284.

The inversely-amplified signal is returned, by the superimposing circuit 244, to the output line of the integrator 214 via the coupling capacitor 246. Therefore, the ripple component is eliminated from the signal voltage as described above.

The frequency-to-voltage converter of this invention is applicable not only to the speedometer but also to a tachometer and other measuring instruments.

According to this invention, the frequency-to-voltage converter can eliminate the ripple component from the signal voltage outputted by the integrator, producing the signal voltage which is in conformity with the frequency of the input signal.

What is claimed is:

1. A frequency-to-voltage converter for driving a cross-coil meter comprising:
   (a) a pulse generator for generating a periodic pulse signal which has a predetermined width at a predetermined period as it relates to the frequency of an input signal supplied to the pulse generator;
   (b) an integrator for integrating the pulse signal and outputting the integrated signal as a signal voltage;
   (c) means for detecting and inverting a ripple component in the output of said integrator and transmitting the inverted output; and
   (d) a superimposing circuit for superimposing the output from said detecting and inverting means on the output of said integrator to eliminate the ripple component.

2. A frequency-to-voltage converter according to claim 1, wherein said inverting means includes a unit for eliminating the direct current component from the output of said integrator and for detecting the remaining components of the output as the ripple component, and an inverting amplifier for inverting and amplifying the ripple component.

3. A frequency-to-voltage converter according to claim 2, wherein said elimainting and detecting unit includes a capacitor for receiving the output from said integrator and supplying the output to said inverting amplifier.

4. A frequency-to-voltage converter according to claim 2, wherein said inverting amplifier includes means for converting the ripple component to current, means for inverting and amplifying the current-converted ripple component, and a voltage converter for converting the current-inverted-and-amplified ripple component to voltage and outputting the voltage-converted ripple component to said superimposing circuit.

5. A frequency-to-voltage converter according to claim 4, wherein said current-inverting-and-amplifying means includes: first and second transistors differentially connected, said first transistor being adapted for receiving the current-converted ripple component; a constant current source for supplying a constant current to said first and second transistors; and a current mirror circuit for varying the current flowing to said second transistor as to have common phase with the current flowing to said first transistor; and wherein said voltage converter includes: a third transistor for outputting a voltage whose phase is reversed when a current flowing through said second transistor is varied; and a pair of output transistors for outputting a voltage which varies with variation of the output voltage of said third transistor.

6. A frequency-to-voltage converter according to claim 2, further including a feedback resistor for returning the output of said inverting amplifier to an input thereof to determine an amplication factor of said inverting amplifier.

7. A frequency-to-voltage converter according to claim 2, wherein said inverting amplifier includes a first transistor in which a resistance between an emitter and collector is varied according to the variation of the ripple component in phase, a second transistor whose output voltage is varied in the phase opposite to the phase of the variation of resistance between said emitter and collector of said first transistor, and a third transistor for supplying to said superimposing circuit a voltage which is varied to a phase same as the phase of the output voltage of said second transistor according to the variation of the resistance between said emitter and collector of said second transistor.

8. A frequency-to-voltage converter according to claim 1, wherein said superimposing circuit includes a coupling capacitor for eliminating the direct current component from the output of said inverting means and for superimposing this output to the output of said integrator.

9. A frequency-to-voltage converter according to claim 1, wherein said integrator includes a resistor connected to said pulse generator, and a capacitor cascade-connected to said resistor.

10. A frequency-to-voltage converter according to claim 1, wherein said pulse generator includes a wave shaping circuit for shaping the waveform of the input signal, and a multivibrator for generating a periodic pulse signal at predetermined periods of the wave-shaped input signal.

11. An automobile meter comprising:
(a) a pulse generator for generating a periodic pulse signal which has a predetermined width at a predetermined period as it relates to the frequency of an input signal supplied to the pulse generator;
(b) an integrator for integrating the pulse signal and outputting the integrated signal as a signal voltage;
(c) means for detecting and inverting a ripple component in the output of said integrator and transmitting an inverted output;
(d) a superimposing circuit for superimposing the output from said detecting and inverting means on the output of said integrator to eliminate the ripple component;
(e) a driving signal generator for generating a plurality of driving signals having different values according to output values of said integrator respectively; and
(f) a plurality of pointer driving coils which are so as to cross each other and to which driving signals are applied from the respective associated drive signal generators.

12. An automobile meter according to claim 11, wherein said driving signal generator includes a sine wave generator for generating sine value corresponding to the output value of said integrator as the driving signal, and a cosine wave generator for generating cosine value corresponding to the output value of said integrator as the drive signal.

13. An automobile meter according to claim 11, further including two meter driving coils which are arranged to cross each other.

* * * * *